US007836315B2

(12) United States Patent
Chase

(10) Patent No.: US 7,836,315 B2
(45) Date of Patent: Nov. 16, 2010

(54) METHOD AND SYSTEM FOR MONITORING MODULE POWER INFORMATION IN A COMMUNICATION DEVICE

(75) Inventor: Bryan Chase, Sunnyvale, CA (US)

(73) Assignee: Broadcom Corp.

( * ) Notice: Subject to any disclaimer, the term of this patent is extended or adjusted under 35 U.S.C. 154(b) by 46 days.

(21) Appl. No.: 12/033,528

(22) Filed: Feb. 19, 2008

(65) Prior Publication Data

US 2008/0139120 A1 Jun. 12, 2008

Related U.S. Application Data

(63) Continuation of application No. 11/014,119, filed on Dec. 15, 2004, now Pat. No. 7,346,788, which is a continuation-in-part of application No. 10/933,371, filed on Sep. 2, 2004.

(60) Provisional application No. 60/577,263, filed on Jun. 4, 2004.

(51) Int. Cl.
*G06F 1/00* (2006.01)
(52) U.S. Cl. ...................................... 713/300
(58) Field of Classification Search ................... 713/300
See application file for complete search history.

(56) References Cited

U.S. PATENT DOCUMENTS 5,764,739 A * 6/1998 Patton et al. ........... 379/106.03
5,945,817 A 8/1999 Nguyen
6,642,852 B2 * 11/2003 Dresti et al. ........... 340/825.72
6,732,301 B1 5/2004 Landry et al.
6,842,144 B2 1/2005 Guo et al.
6,986,074 B2 * 1/2006 Alia et al. .................... 713/601
7,055,046 B2 * 5/2006 Malueg et al. .............. 713/320
7,240,225 B2 * 7/2007 Brewer et al. ............... 713/300

* cited by examiner

*Primary Examiner*—Thomas Lee
*Assistant Examiner*—Eric Chang
(74) *Attorney, Agent, or Firm*—McAndrews, Held & Malloy, Ltd.

(57) ABSTRACT

System and method for communication are disclosed and may include, in a single chip that includes one or more on-chip devices, where the one or more on-chip devices are enabled to receive wireless signals and transmit wireless signals, receiving at a first of the one or more on-chip devices, a wireless signal that queries power information for the first of the one or more on-chip devices. The power information for the first of the one or more on-chip devices may be acquired and communicated to an off-chip device. The acquired power information may be wirelessly communicated to the off-chip device via an antenna and/or an infrared transmitter on the single chip. The acquired power information may also be communicated to an off-chip device via a wired connection on the single chip and/or via a general purpose input/output (GPIO) connection on the single chip.

32 Claims, 6 Drawing Sheets

METHOD AND SYSTEM FOR MONITORING MODULE POWER INFORMATION IN A COMMUNICATION DEVICE

CROSS-REFERENCE TO RELATED APPLICATIONS/INCORPORATION BY REFERENCE

This application is a continuation of U.S. patent application Ser. No. 11/014,119 filed Dec. 15, 2004, which is a continuation-in-part of U.S. patent application Ser. No. 10/933,371, filed Sep. 2, 2004, which makes reference to, claims priority to, and claims the benefit of U.S. Provisional Application Ser. No. 60/577,263 filed Jun. 4, 2004 and entitled "Method And System For Monitoring Module Power Status In A Communication Device."

The above stated applications are hereby incorporated herein by reference in their entirety.

FIELD OF THE INVENTION

Certain embodiments of the invention relate to monitoring operating status of a communication device. More specifically, certain embodiments of the invention relate to a method and system for monitoring power information of various modules in a communication device such as a wireless handset.

BACKGROUND OF THE INVENTION

Power usage is an important factor in wireless communications, especially for mobile communication devices that have a very limited battery capacity. With on-going development of wireless technology, there is a constant effort to reduce power consumption on these mobile communication devices such as wireless handsets. Reduction of power consumption in a wireless handset may necessitate reduction in the real estate of the silicon on a chip. In addition, power consumption within the chip may need to be analyzed so that more optimal use of the power resources within a wireless handset is accomplished.

A conventional method of analyzing power consumption within a chip is by utilizing liquid crystals. In this regard, a chip may be decapped by removing the plastic cover from its top and depositing liquid crystals on the surface of the decapped chip. The chip may then be powered-up and configured to operate in a certain operating mode. Certain modules within the chip may utilize excessive power due to, for example, being turned on for a prolonged period of time. Due to the continuous or increased power consumption in such module, the liquid crystal just above the module may begin to boil and form bubbles. The boiling of the liquid crystal above the module may lead to discoloration and the appearance of "spots" over the module with excessive power consumption. In this way, the specific module with excessive power consumption may be identified under a microscope and proper adjustments may be performed on the module and/or the chip. If, on the other hand, there are no modules within the chip that are characterized with excessive power consumption, the liquid crystal hardens uniformly without any "spots" or discolorations.

While this conventional method may be effective in analyzing power consumption within a chip, it is very impractical and time-consuming since the chip has to be separated from the handset, placed on a special board, decapped, covered with liquid crystal, powered-up and then analyzed under a microscope. Furthermore, it is very difficult to effectively perform such operations while the device is in operation. Additionally, issues with power consumption manifest themselves during operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain aspects of the invention may be found in a method and system for monitoring operating status of a device. Aspects of the method may comprise receiving within a chip, a wireless signal indicative of a power information of an on-chip device and generating from within the chip, a wireless output signal indicative of the power information while the chip is operating. The power information may comprise power consumption. The generated wireless output signal may be communicated outside the chip via an antenna and/or an infrared transmitter or transceiver interface. A power information query signal corresponding to the on-chip device may be received wirelessly within the chip and the on-chip device may generate a wireless output signal indicative of the power information, corresponding to the received power information query signal.

The generated wireless output signal may comprise a clock signal and/or a data signal and the data signal may comprise sequential power information for one or more on-chip devices. After acquiring a first wireless signal indicative of the power information of the on-chip device, a second wireless signal indicative of the power information of the on-chip device may also be acquired. A difference between the first and the second wireless signals may be determined and the difference may be reported if it is non-zero. The second wireless signal indicative of the power information of the on-chip device may be reported if the determined difference is non-zero.

Aspects of the system may comprise at least one signal generator that generates within a chip a wireless signal indicative of a power information of an on-chip device, where the signal generator may be coupled to a power rail within the chip. At least one power analyzer may receive within the chip, the wireless signal indicative of the power information and the power analyzer may generate from within the chip, a wireless output signal indicative of the power information while the chip is operating. The power analyzer may communicate the generated wireless output signal outside the chip via an antenna and/or an infrared transmitter or transceiver interface. The signal generator may receive wirelessly within the chip, a power information query signal corresponding to the on-chip device.

The signal generator may generate a wireless output signal indicative of the power information, corresponding to the received power information query signal. The generated wireless output signal may comprise a clock signal and/or a data signal and the data signal may comprise sequential power information for one or more on-chip devices. The power analyzer after acquiring a first wireless signal indicative of the power information of the on-chip device, may acquire a second wireless signal indicative of the power information of the on-chip device. The power analyzer may then determine a difference between the first wireless signal and the second wireless signal. The power analyzer may report the determined difference if the determined difference is non-zero. The power analyzer may also report the second wireless signal indicative of the power information of the on-chip device if the determined difference is non-zero.

These and other advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for monitoring operating status of a device, such as a wireless handset for example. A signal indicative of a power information of an on-chip device may be received wirelessly by a main power analyzer module within a chip. The power information may comprise power consumption. The chip may comprise a plurality of component integrated circuits (ICs) integrated on a single package. One or more on-chip devices may each utilize separate power analyzers that may be adapted to acquire power information corresponding to each device and communicate the acquired power information to the main power analyzer within the chip. An output signal indicative of the received power information may be generated within the chip, while the chip is operating. The signal indicative of the power information may be communicated outside the chip via an antenna and/or an infrared transmitter or transceiver interface. In one aspect of the invention, each on-chip device power analyzer may be adapted to receive a query signal for power information corresponding to each on-chip device. The on-chip device power analyzer may individually acquire such power information and wirelessly communicate at least a portion of the acquired power information outside the chip. The power information signal may then be processed by an external processing system such as a computer (PC). An external device such as a PC may display a list, for example, of the devices within the chip that utilize the most power. Other processing may be done by the external device once the signal indicative of power information is communicated outside the chip.

Figure 1:
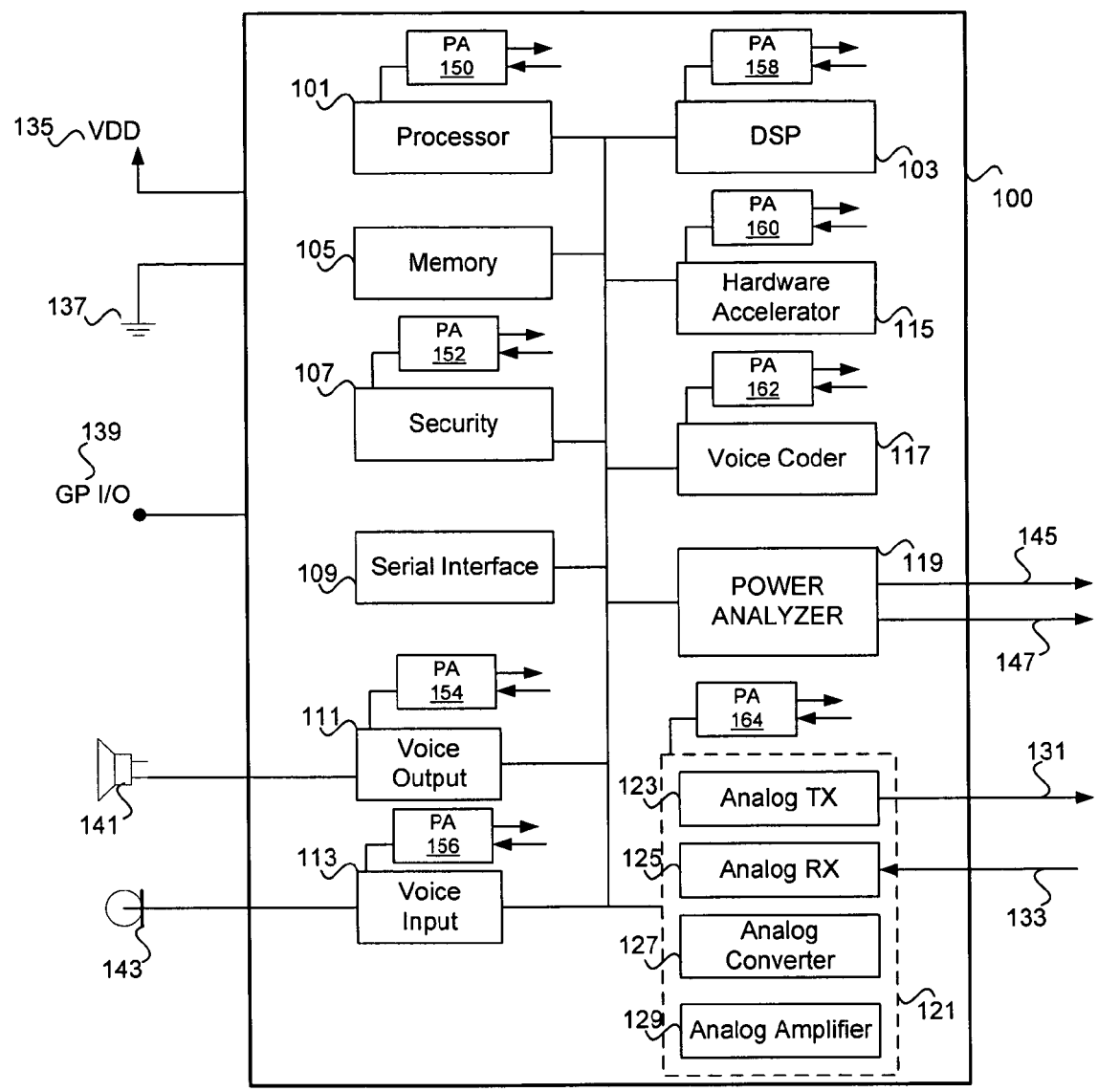
FIG. 1 is a block diagram of an exemplary chip architecture utilizing wireless connectivity, in accordance with an embodiment of the invention.

FIG. 1 is a block diagram of an exemplary chip architecture 100 utilizing wireless connectivity, in accordance with an embodiment of the invention. The chip 100 may comprise a plurality of component integrated circuits (ICs) integrated on a single package. For example, the chip 100 may comprise a processor 101, a digital signal processor (DSP) 103, memory 105, a hardware accelerator module 115, a security module 107, a voice coder module 117, a serial interface 109, a main power analyzer module 119, a voice output module 111, a voice input module 113, an analog processing module 121, and device power analyzer modules 150 through 164. The analog processing module 121 may comprise an analog transmit (TX) module 123, an analog receive (RX) module 125, an analog converter 127 and an analog amplifier 129.

The chip 100 may be connected to a voltage source $V_{DD}$ 135 and a ground connection 137. The chip 100 may receive and output signals via general purpose input/output (GPIO) pins 139. The voice output module 111 may be adapted to generate output audio signals to a speaker 141. The voice input module 113 may be adapted to receive voice signals via a microphone 143. The analog TX module 123 may be adapted to transmit an analog signal 131, and the analog RX module 125 may be adapted to receive an analog signal 133, which may subsequently be processed by the analog converter 127 and the analog amplifier 129.

The hardware accelerator module 115 comprises suitable circuitry, logic and/or code that may be adapted to perform channel coding within the chip 100. The voice coder module 117 comprises suitable circuitry, logic and/or code that may be adapted to perform voice coding within the chip 100. The main power analyzer module 119 comprises suitable circuitry, logic and/or code that may be adapted to receive wirelessly power information related to modules within the chip 100. For example, the main power analyzer module 119 may be adapted to receive power information wirelessly communicated from the device power analyzers 150 through 164. The received power information may corresponding to power consumption within the processor 101, the security module 107, the voice output module 111, the voice input module 113, the DSP 103, the hardware accelerator 115, the voice coder module 117, and the analog processing module 121, respectively.

The device power analyzers 150 through 164 comprise suitable circuitry, logic and/or code and may be adapted to acquire power information from the processor 101, the security module 107, the voice output module 111, the voice input module 113, the DSP 103, the hardware accelerator 115, the voice coder module 117, and the analog processing module 121, respectively. Each of the device power analyzer modules 150 through 164 may be integrated as a separate component on the chip 100 and may comprise a transmitter or transceiver interface adapted to wirelessly receive one or more query signals and generate a wireless response signal indicative of power information. After power information is acquired from the corresponding on-chip device, each of the device power analyzers 150 through 164 may communicate the power information wirelessly outside the chip 100 or to the main power analyzer module 119 for further processing, such as communication outside the chip 100.

In an exemplary aspect of the invention, each of the device power analyzers 150 through 164 may be adapted to receive a wireless query signal and, as a result, may acquire power information and generate a wireless response signal indicative of the acquired power information. A wireless response signal may then be communicated by each of the device power analyzers 150 through 164 outside the chip 100 or to the main power analyzer 100 for further processing. The wireless response signal may be communicated via an antenna and/or an infrared transmitter or transceiver interface, for example.

In operation, the main power analyzer module 119 may obtain power information associated with on-chip devices within the chip 100 via wireless signals from the on-chip devices. For example, power information such as power consumption may be individually measured in real time for each module within the chip 100. In one aspect of the invention, the main power analyzer module 119 may be adapted to output wirelessly a clock signal 145 and a data signal 147. The data signal 147 may comprise sequential power information related to modules or on-chip devices within the chip 100. The data signal 147 and the clock signal 145 may be communicated wirelessly outside the chip 100 for further processing. For example, the data signal 147 and the clock signal 145 may be communicated by the main power analyzer 119 via an antenna and/or via an infrared transmitter or transceiver interface.

Figure 2:
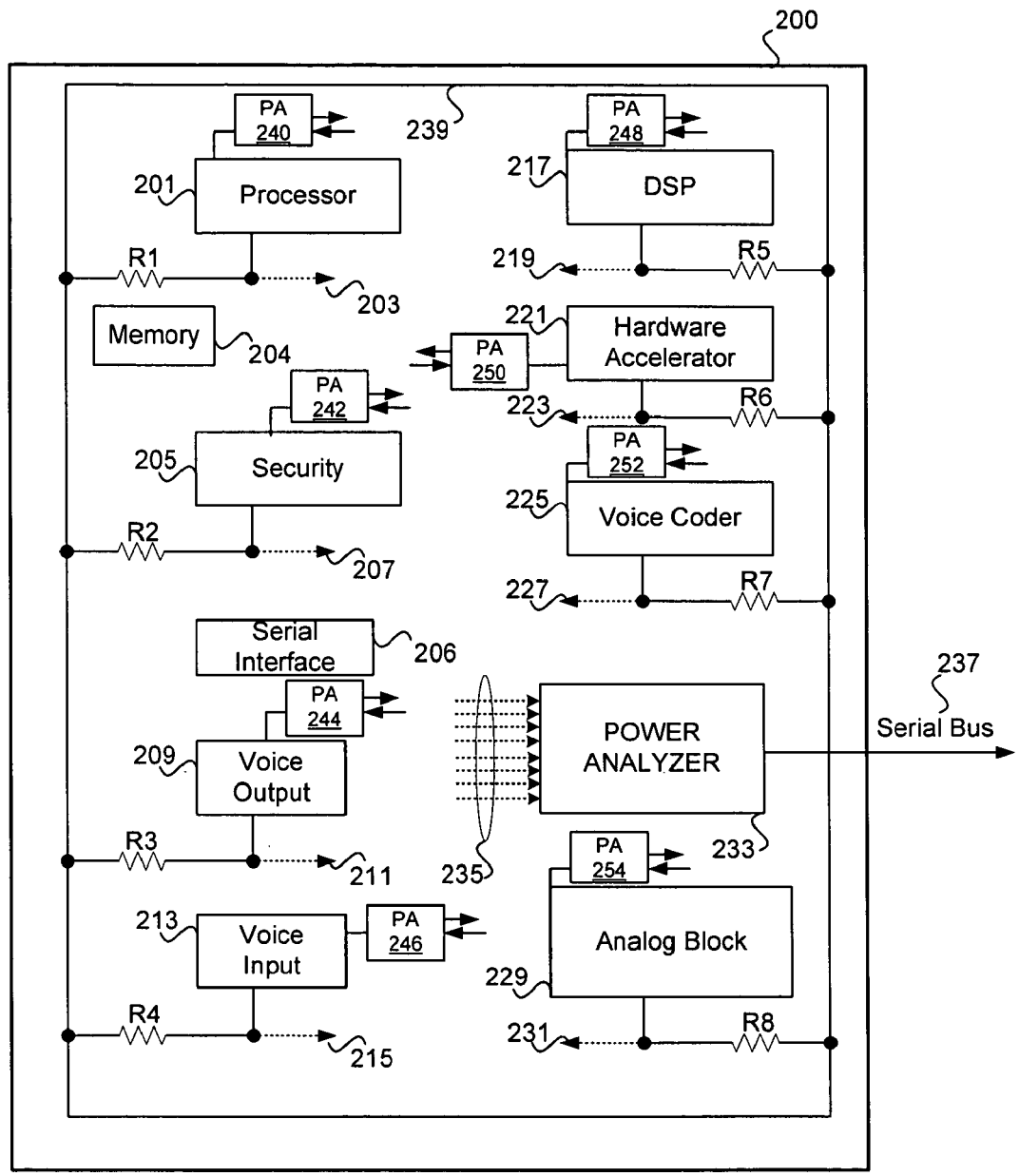
FIG. 2 is a block diagram of the exemplary chip architecture of FIG. 1 illustrating power information output via a serial bus, in accordance with an embodiment of the invention.

FIG. 2 is a block diagram of the exemplary chip architecture of FIG. 1 illustrating power information output via a serial bus, in accordance with an embodiment of the invention. Referring to FIG. 2, the chip 200 may comprise a processor 201, a digital signal processor (DSP) 217, memory 204, a hardware accelerator module 221, a security module 205, a voice coder module 225, a serial interface 206, a main power analyzer module 233, a voice output module 209, a voice input module 213, an analog processing module 229, resistor drops 203, 207, 211, 215, 219, 223, 227 and 231, device power analyzer modules 240 through 254, and a power rail 239 for supplying power to all modules within the chip 200. For example, the power rail 239 may supply power to the processor 201, the security module 205, the voice output module 209, the voice input module 213, the DSP 217, the hardware accelerator 221, the voice coder module 225 and the analog block 229. Power information 235, such as power consumption, may be acquired from each of the resistor drops 203, 207, 211, 215, 219, 223, 227 and 231 and may be communicated wirelessly to the main power analyzer module 233.

The device power analyzers 240 through 254 comprise suitable circuitry, logic and/or code and may be adapted to acquire power information from the processor 201, the security module 205, the voice output module 209, the voice input module 213, the DSP 217, the hardware accelerator 221, the voice coder module 225, and the analog processing module 229, respectively. Each of the device power analyzer modules 240 through 254 may be integrated as a separate component on the chip 200 and may comprise a transmitter or transceiver interface adapted to wirelessly receive one or more query signals and generate a wireless response signal indicative of power information. After power information is acquired from the corresponding on-chip device, each of the device power analyzers 240 through 254 may be adapted to communicate the power information wirelessly to the main power analyzer module 233 for further processing, such as communication outside the chip 100.

In an exemplary aspect of the invention, each of the device power analyzers 240 through 254 may utilize resistor drops R1, R2, R3, R4, R5, R6, R7 and R8 to measure power information, such as power consumption, within the processor 201, the security module 205, the voice output module 209, the voice input module 213, the DSP 217, the hardware accelerator 221, the voice coder module 225, and the analog processing module 229, respectively. The resistor drops 203, 207, 211, 215, 219, 223, 227 and 231 may be adapted to measure power information, such as power consumption, in real time and to communicate the measured power information to a corresponding device power analyzer. Each of the device power analyzers 240 through 254 may then communicate the acquired power information wirelessly to the main power analyzer 233. For example, power information 235 from each of the resistor drops 203, 207, 211, 215, 219, 223, 227 and 231 may be communicated wirelessly to the main power analyzer module 233 for further processing.

In another aspect of the invention, after the main power analyzer module 233 wirelessly receives the power information 235, the power information 235 may be communicated externally via a serial bus connection 237. A "round robin" scheme may be utilized where the main power analyzer module 233 outputs consecutive power information for specific modules within the chip 200, so that power information for all power-consuming modules within the chip 200 may be outputted via the serial bus 237 for a determined period of time.

Figure 3:
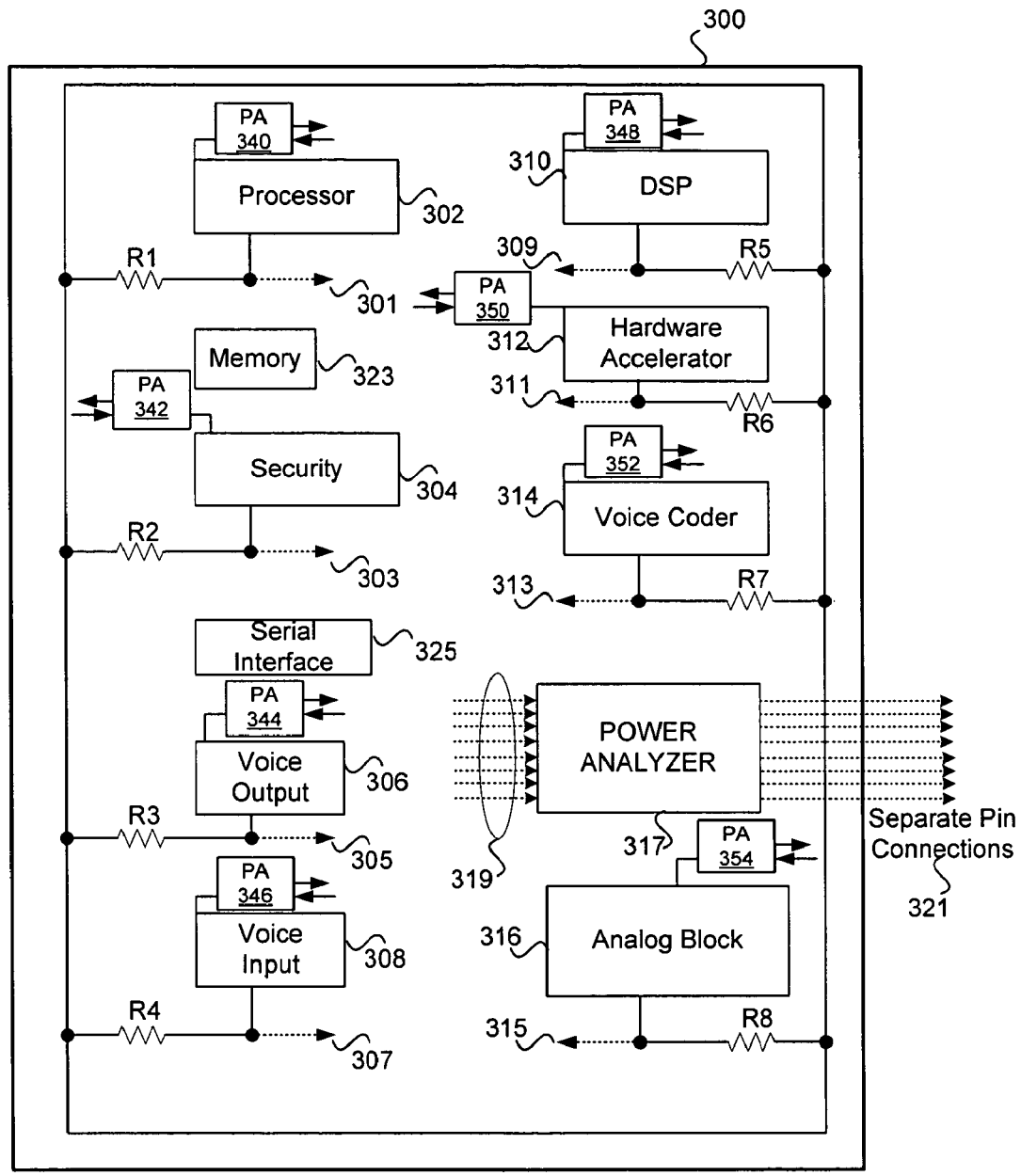
FIG. 3 is a block diagram of the exemplary chip architecture of FIG. 1 illustrating power information output via separate pin connections, in accordance with an embodiment of the invention.

FIG. 3 is a block diagram of the exemplary chip architecture of FIG. 1 illustrating power information output via separate pin connections, in accordance with an embodiment of the invention. Referring to FIG. 3, the chip 300 may comprise a processor 302, a digital signal processor (DSP) 310, memory 323, a hardware accelerator module 312, a security module 304, a voice coder module 314, a serial interface 325, a main power analyzer module 317, a voice output module 306, a voice input module 308, an analog processing module 316, resistor drops 301, 303, 305, 307, 309, 311, 313 and 315, and device power analyzers 340 through 354. Power information 319, such as power consumption, may be acquired from each of the resistor drops 301, 303, 305, 307, 309, 311, 313 and 315 and may be communicated wirelessly to the main power analyzer module 317.

In an exemplary aspect of the invention, each of the device power analyzers 340 through 354 may utilize resistor drops R1 through R8 to measure power information within the processor 302, the security module 304, the voice output module 306, the voice input module 308, the DSP 310, the hardware accelerator 312, the voice coder module 314, and the analog processing module 316, respectively. The resistor drops 301 through 315 may be adapted to measure the power information, including power consumption, in real time and to communicate the measured power information to a corresponding device power analyzer. Each of the device power analyzer modules 340 through 354 may be integrated as a separate component on the chip 300 and may comprise a transmitter or transceiver interface adapted to wirelessly receive one or more query signals and generate a wireless response signal indicative of power information. For example, each of the device power analyzers 340 through 354 may communicate the acquired power information wirelessly to the main power analyzer 317. For example, power information from each of the resistor drops 301 through 315 may be communicated wirelessly to the main power analyzer module 317 for further processing.

In another aspect of the invention, after the main power analyzer module 317 wirelessly receives the power information 319, the power information 319 may be communicated outside the chip 300 via separate pin connections 321. Each of the separate pin connections 321 may be indicative of power information for a single module or for a plurality of modules within the chip 300.

Figure 4:
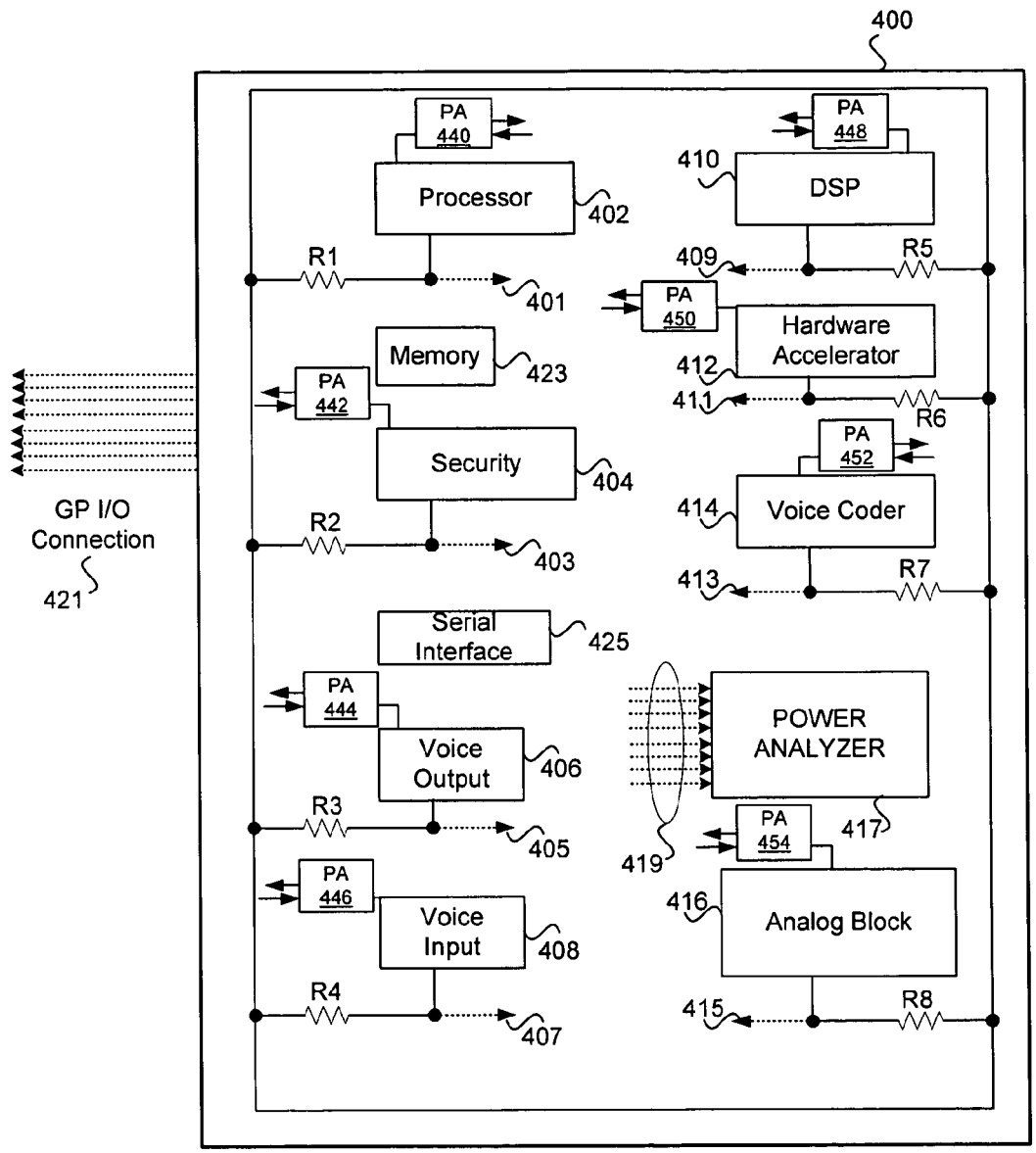
FIG. 4 is a block diagram of the exemplary chip architecture of FIG. 1 illustrating power information output via a general purpose input/output connection, in accordance with an embodiment of the invention.

FIG. 4 is a block diagram of the exemplary chip architecture of FIG. 1 illustrating power information output via a general purpose input/output connection, in accordance with an embodiment of the invention. Referring to FIG. 4, the chip 400 may comprise a processor 402, a digital signal processor (DSP) 410, memory 423, a hardware accelerator module 412, a security module 404, a voice coder module 414, a serial interface 425, a power analyzer module 417, a voice output module 406, a voice input module 408, an analog processing module 416, resistor drops 401 through 415, and device power analyzers 440 through 454. Power information 419, such as power consumption, may be acquired from each of the resistor drops 401 through 415 and may be communicated wirelessly to the main power analyzer module 417.

In an exemplary aspect of the invention, each of the device power analyzers 440 through 454 may utilize resistor drops R1 through R8 to measure power information within the processor 402, the security module 404, the voice output module 406, the voice input module 408, the DSP 410, the hardware accelerator 412, the voice coder module 414, and the analog processing module 416, respectively. The resistor drops 401 through 415 may be adapted to measure power information, including power consumption, in real time and to communicate the measured power information to a corresponding device power analyzer. Each of the device power analyzer modules 440 through 454 may be integrated as a separate component on the chip 400 and may comprise a transmitter or transceiver interface adapted to wirelessly receive one or more query signals and generate a wireless response signal indicative of power information. For example, each of the device power analyzers 440 through 454 may then communicate the acquired power information wirelessly to the main power analyzer 417. For example, power information from each of the resistor drops 401 through 415 may be communicated wirelessly to the main power analyzer module 417 for further processing.

In another aspect of the invention, after the power analyzer module 417 wirelessly receives the power information 419, the power information 419 may be communicated outside the chip 400 via a general purpose input/output (GPIO) connection 421. The GPIO 421 may be coupled to a multiplexer within the chip 400 so that output power information may be communicated via the GPIO 421.

Figure 5:
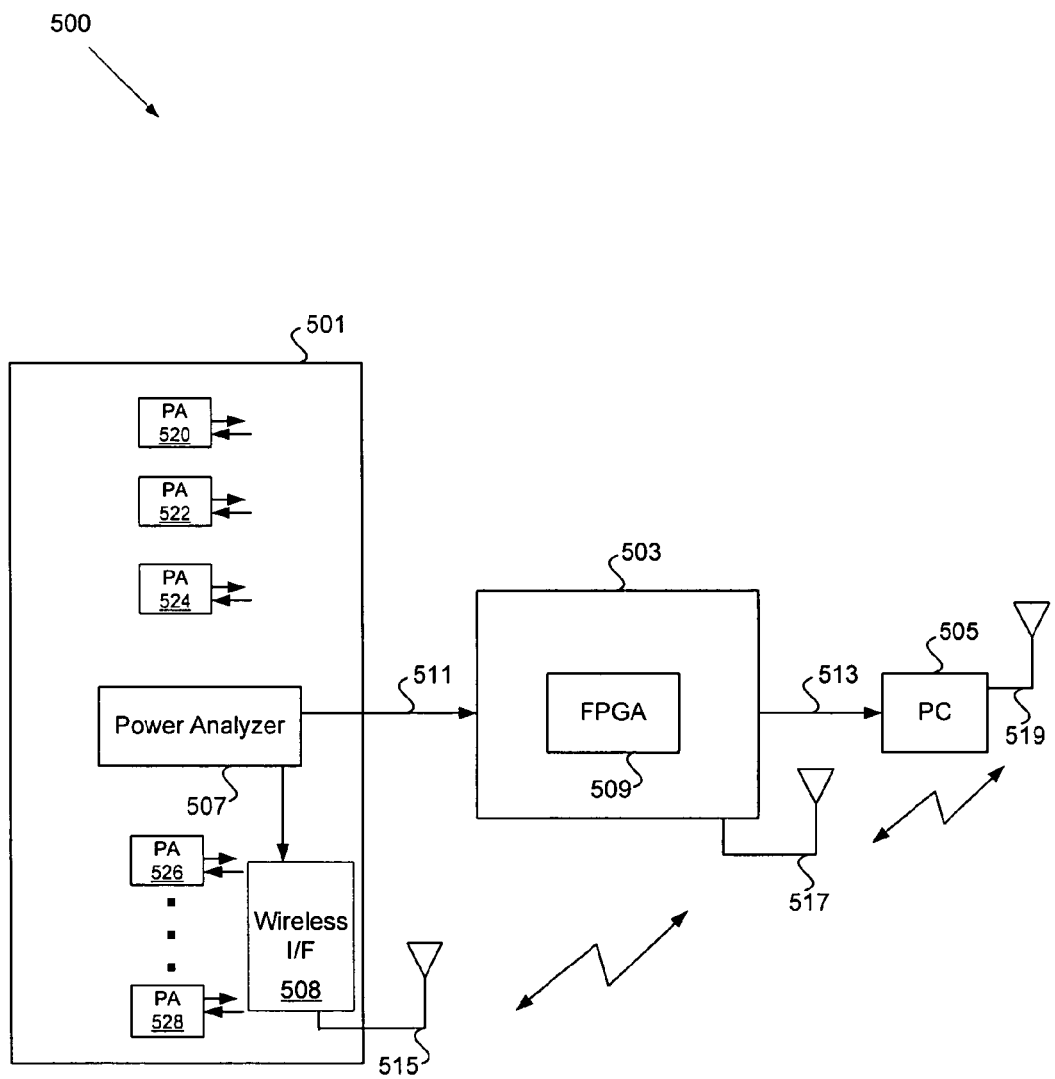
FIG. 5 is a block diagram of an exemplary system utilizing wireless power information monitoring, in accordance with an embodiment of the invention.

FIG. 5 is a block diagram of an exemplary system 500 utilizing wireless power information monitoring, in accordance with an embodiment of the invention. Referring to FIG. 5, the system 500 may comprise a chip 501, an external interface 503, an external processing device 505, and antennas 515, 517, and 519. The chip 501 may be adapted for use in a wireless handset and may be similar to the chip 100 illustrated on FIG. 1.

The chip 501 may comprise a main power analyzer module 507, a wireless interface 508, and a plurality of device power analyzer modules 520 through 528. Each of the device power analyzer modules 520 through 528 may be coupled to an on-chip device within the chip 501 and may be adapted to acquire power information, such as power consumption, and communicate it wirelessly outside the chip 501 and/or to the main power analyzer module 507. For example, each of the device power analyzer modules 520 through 528 may receive a wireless query signal for power information. In response, each of the device power analyzer modules 520 through 528 may acquire power information from the corresponding on-chip device, for example through resistor drops, and may generate a response signal. The response signal indicative of power consumption, for example, may be communicated wirelessly outside the chip 501 and/or to the main power analyzer module 507 for further processing. Each of the device power analyzer modules 520 through 528 may be adapted to communicate the response signal indicative of power consumption to the wireless interface 508. In addition, the power analyzer module 507 may communicate one or more response signals indicative of power consumption to the wireless interface 508. The wireless interface 508 may be adapted to transmit wirelessly outside the chip 501 the acquired power consumption information via the antenna 515.

The main power analyzer module 507 comprises suitable circuitry, code and/or logic and may be adapted to wirelessly receive power information related to modules within the chip 501. In addition, the main power analyzer module 507 may communicate the received power information to the interface 503 via the connection 511. The connection 511 may comprise a serial bus or a wireless connection, for example. In addition, the power analyzer module 507 may be adapted to communicate signals indicative of on-chip power consumption to the wireless interface 508 for wireless transmission via the antenna 515.

The external interface 503 may comprise a programmable processor 509 and an antenna 517. The programmable processor 509 may comprise a field programmable gate array (FPGA), for example. The interface 503 may also comprise an application-specific integrated circuit (ASIC). The interface 503 may be adapted to pre-process the power information received from the chip 501 so that it may be further processed by the processing device 505. The pre-processed power information may be communicated from the interface 503 to the external processing device 505 via the connection 513. The connection 513 may comprise a serial bus, for example. In an exemplary aspect of the invention, the external interface may comprise an antenna 517 and may be adapted to receive wirelessly from the chip 501 signals indicative of on-chip power consumption within the chip 501.

The external processing device 505 may comprise a PC or other external monitoring device that may be adapted to process the power information received from the interface 503. In one aspect of the invention, the external processing device 505 may be adapted to display a list with a determined number of devices within the chip 501 with their respective power information. For example, the external processing device 505 may display a list of the top ten power-consuming modules within the chip 501 and the exact power that was, or is being, consumed. In one aspect of the invention, real-time power information may be collected by the power analyzer module 507 within the chip 501 and communicated to the processing device 505 via the interface 503. In another aspect of the invention, the external processing device 505 may be adapted to provide a visual indication of the amount of power being consumed by one or more modules coupled to the chip 501. The visual indication may include one or more LEDs. In yet another exemplary aspect of the invention, the external processing device 505 may comprise an antenna 519 and may be adapted to wirelessly receive signals indicative of the power consumption within the chip 501. Such signals may be received by the processing device 505 from the external interface 503 and/or from the chip 501, for example.

Figure 6:
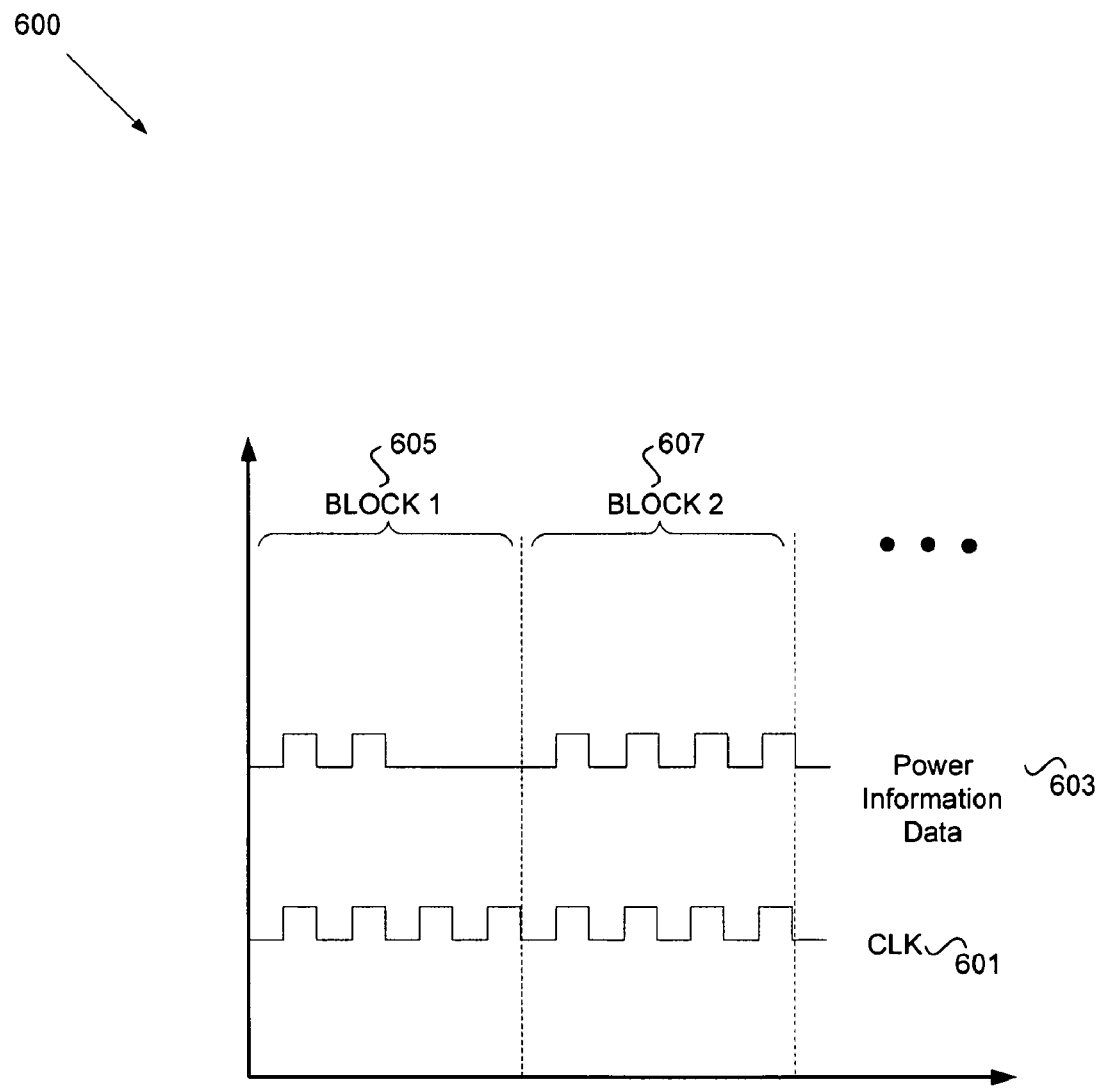
FIG. 6 is a timing diagram illustrating exemplary power information timing, in accordance with an embodiment of the invention.

FIG. 6 is a timing diagram 600 illustrating exemplary power information timing, in accordance with an embodiment of the invention. The graphical diagram 600 illustrates a timing diagram of a clock signal 601 and power information data 603. In one aspect of the invention, a power analyzer module, for example, which may be integrated within a chip, may be adapted to wirelessly receive power information related to modules within the chip. The power analyzer module may then output the power information data and a clock signal via a wireless signal for further processing outside the chip. The power information data and the clock signal may be characterized by the timing diagrams 603 and 601, respectively.

In one aspect of the invention, a determined number of clock cycles may represent the power information, such as power consumption, of a specific block within the chip. For example, current power consumption within a specific block may be associated with a determined number of active bits. In this way, the power information data 603 may represent power consumption for a first block 605 and for a second block 607 within the chip. Each block within the chip may be associated with four bits, for example. Since the second block 607 contains four active bits and the first block 605 contains two active bits, it may be determined that the second block 607 is currently consuming more power than the first block 605.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
   in a single chip comprising a plurality of on-chip devices, wherein said plurality of on-chip devices are enabled to receive wireless signals and transmit wireless signals,
   receiving at each of said plurality of on-chip devices, a wireless signal that queries power information for said each of said plurality of on-chip devices;
   acquiring, from each of said plurality of on-chip devices, said power information for said each of said plurality of on-chip devices; and
   communicating said acquired power information to an off-chip device.

2. The method according to claim 1, comprising wirelessly communicating said acquired power information to said off-chip device.

3. The method according to claim 2, comprising wirelessly communicating said acquired power information to said off-chip device via an antenna or an infrared transmitter on said single chip.

4. The method according to claim 1, comprising communicating said acquired power information to an off-chip device via a wired connection on said single chip.

5. The method according to claim 1, comprising communicating said acquired power information to said off-chip device via a general purpose input/output (GPIO) connection on said single chip.

6. The method according to claim 1, comprising communicating said acquired power information to said off-chip device via a plurality of pin connections.

7. The method according to claim 1, comprising receiving said wireless signal that queries said power information from a wireless device that is external to said single chip.

8. The method according to claim 1, wherein said plurality of on-chip devices comprise a wireless transceiver interface.

9. The method according to claim 1, wherein said power information comprises one or both of a clock signal and/or a data signal.

10. The method according to claim 9, wherein said data signal comprises sequential power information for a plurality of on-chip devices.

11. The method according to claim 1, comprising receiving said wireless signal that queries said power information via a wireless device that is integrated within said single chip.

12. The method according to claim 1, wherein said power information comprises power consumption.

13. The method according to claim 1, comprising after acquiring a first signal indicative of power information of a first of said plurality of on-chip devices, acquiring a second signal indicative of said power information of said first of said plurality of on-chip devices.

14. The method according to claim 13, comprising determining a difference between said first signal and said second signal.

15. The method according to claim 14, comprising reporting said determined difference, if said determined difference is non-zero.

16. The method according to claim 14, comprising reporting said second signal indicative of said power information of said first of said plurality of on-chip devices, if said determined difference is non-zero.

17. A system for communication, the system comprising:
   in a single chip comprising a plurality of on-chip devices, wherein said plurality of on-chip devices are enabled to receive wireless signals and transmit wireless signals,
   at least one processor that is operable to receive at each of said plurality of on-chip devices, a wireless signal that queries power information for said each of said plurality of on-chip devices;
   said at least one processor is operable to acquire, from each of said plurality of on-chip devices, said power information for said each of said plurality of on-chip devices; and
   said at least one processor is operable to communicate said acquired power information to an off-chip device.

18. The system according to claim 17, wherein said at least one processor is operable to wirelessly communicate said acquired power information to said off-chip device.

19. The system according to claim 18, wherein said at least one processor is operable to wirelessly communicate said acquired power information to said off-chip device via an antenna or an infrared transmitter on said single chip.

20. The system according to claim 17, wherein said at least one processor is operable to communicate said acquired power information to an off-chip device via a wired connection on said single chip.

21. The system according to claim 17, wherein said at least one processor is operable to communicate said acquired power information to said off-chip device via a general purpose input/output (GPIO) connection on said single chip.

22. The system according to claim 17, wherein said at least one processor is operable to communicate said acquired power information to said off-chip device via a plurality of pin connections.

23. The system according to claim 17, wherein said at least one processor is operable to receive said wireless signal that queries said power information from a wireless device that is external to said single chip.

24. The system according to claim 17, wherein said plurality of on-chip devices comprise a wireless transceiver interface.

25. The system according to claim 17, wherein said power information comprises one or both of a clock signal and/or a data signal.

26. The system according to claim 25, wherein said data signal comprises sequential power information for a plurality of on-chip devices.

27. The system according to claim 17, wherein said at least one processor is operable to receive said wireless signal that queries said power information via a wireless device that is integrated within said single chip.

28. The system according to claim 17, wherein said power information comprises power consumption.

29. The system according to claim 17, wherein said at least one processor is operable to acquire a second signal indicative of power information of a first of said plurality of on-chip devices, after acquiring said first signal indicative of said power information of said first of said plurality of on-chip devices.

30. The system according to claim 29, wherein said at least one processor is operable to determine a difference between said first signal and said second signal.

31. The system according to claim 30, wherein said at least one processor is operable to report said determined difference, if said determined difference is non-zero.

32. The system according to claim 30, wherein said at least one processor is operable to report said second signal indicative of said power information of said first of said plurality of on-chip devices, if said determined difference is non-zero.

* * * * *